United States Patent [19]

Blanchard

[11] Patent Number: 5,574,301

[45] Date of Patent: Nov. 12, 1996

[54] VERTICAL SWITCHED-EMITTER STRUCTURE WITH IMPROVED LATERAL ISOLATION

[75] Inventor: Richard A. Blanchard, Los Altos, Calif.

[73] Assignee: SGS-Thomson Microelectronics, Inc., Carrollton, Tex.

[21] Appl. No.: 528,687

[22] Filed: Sep. 15, 1995

Related U.S. Application Data

[62] Division of Ser. No. 397,710, Feb. 28, 1995.

[51] Int. Cl.$^6$ .......................... H01L 29/76; H01L 29/94; H01L 31/062; H01L 31/113
[52] U.S. Cl. ................................ 257/329; 257/378
[58] Field of Search ........................ 257/329, 378

[56] References Cited

U.S. PATENT DOCUMENTS 4,487,639  12/1984  Lam et al. .
4,868,626   9/1989  Nakazato et al. .
4,881,119  11/1989  Paxman et al. .
4,935,799   6/1990  Mori et al. .
5,118,635   6/1992  Frisina .
5,247,200   9/1993  Momose et al. .
5,380,670   1/1995  Hagino .
5,424,231   6/1995  Yang .

OTHER PUBLICATIONS

Richard A. Blanchard, "A Power Transistor with an Integrated Thermal Feedback Mechanisim" Massachusetts Institute of Technology Masters Dissertation, Jul. 1970.

*Primary Examiner*—Stephen Meier
*Attorney, Agent, or Firm*—Theodore E. Galanthay; Robert Groover; Lisa K. Jorgenson

[57] ABSTRACT

A vertical switched-emitter device structure in which the body of a vertical-current-flow MOS device is formed in a P-type surface epi region, and dielectric isolation laterally separates the body from the surface contact to the buried P-type base region.

12 Claims, 5 Drawing Sheets

VERTICAL SWITCHED-EMITTER STRUCTURE WITH IMPROVED LATERAL ISOLATION

This is a division of application Ser. No. 08/397,710, filed Feb. 28, 1995, pending.

BACKGROUND AND SUMMARY OF THE INVENTION

The present invention relates to power semiconductor device structures for high-voltage and/or high-power operating conditions.

Emitter switching is a circuit configuration in which a low-voltage power transistor (typically an MOS transistor) cuts off the emitter current of a high-voltage power transistor (typically a bipolar transistor) in order to switch it off. This configuration offers the following advantages:
it helps protect the bipolar transistor against reverse secondary breakdown (ESB);
it combines the current and voltage carrying capacity of a piloted transistor and the high speed of a low-voltage transistor;
it enables the system to be piloted directly with linear logic circuits, through the MOS gate.

U.S. Pat. Nos. 5,118,635 and 5,065,213 describe a pioneering improvement in switched-emitter device structures. In the primary embodiment described in these patents, a power bipolar transistor is overlaid with a power MOS (VDMOS) device. The VDMOS device is a vertical-current-flow device which is easily switched by an insulate gate at its surface. The drain of the VDMOS device is a buried layer which ALSO functions as the emitter of a power bipolar device. Thus the on or off state of the VDMOS changes the potential of the bipolar device's emitter (hence the name of the device). The base of the bipolar device is another buried layer (surrounding and deeper than the emitter layer), which is held at constant potential. When the VDMOS is turned on, its conduction pulls up the drain/emitter diffusion. This forward biases the base/emitter junction to turn on the bipolar. Once the bipolar is turned on it provides a lower on-resistance per unit area than would a MOS transistor of the same breakdown voltage (due to bipolar conduction and associated regeneration gain). Thus this structure provides a uniquely advantageous improvement in the tradeoff between on-resistance Ron and breakdown voltage Vmax.

The present application provides a combined structure which includes a high-voltage bipolar power transistor, and a low-voltage vertical-current-flow MOS power transistor structure which has its channel formed in a recess, combined in an emitter switching configuration.

In the disclosed embodiments the vertical MOS device is not necessarily a VDMOS device, but instead is built in a top p- epi layer, and is laterally dielectrically isolated from the sinker diffusions which make contact to the base of the bipolar transistor. (The top p- epi layer is not readily adaptable to VDMOS devices.)

In a first sample embodiment, the MOS transistor is a VMOS device.

In a second sample embodiment, the MOS transistor is a trench transistor.

BRIEF DESCRIPTION OF THE DRAWING

The disclosed inventions will be described with reference to the accompanying drawings, which show important sample embodiments of the invention and which are incorporated in the specification, hereof by reference, wherein.

DETAILED DESCRIPTION OF THE PREFERRED EMBODIMENTS

Figure 1A:
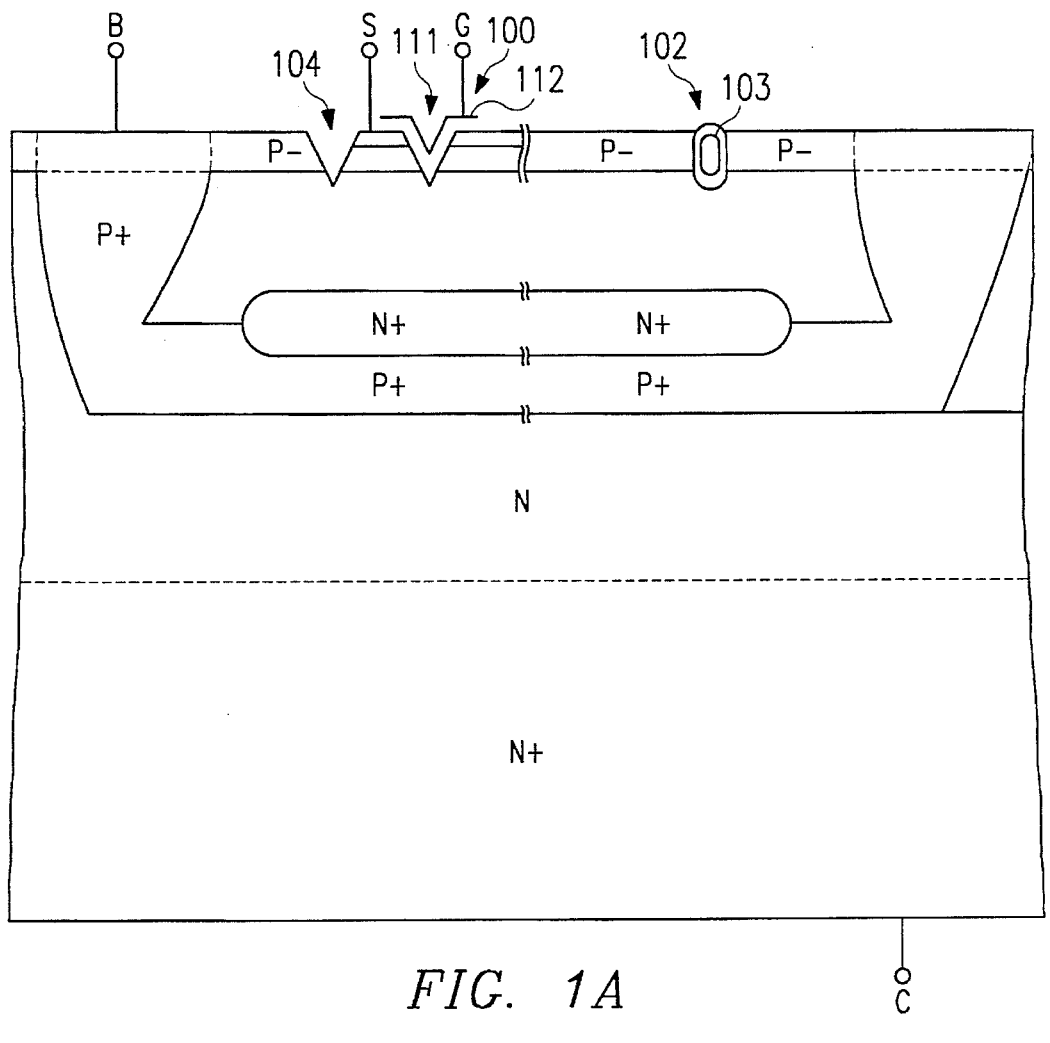
FIG. 1A is a cross-section which shows both a first embodiment of the invention (on the left side) and a second embodiment (on the right side)
Figure 1B:
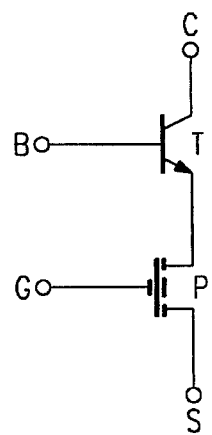
FIG. 1B is a circuit diagram which shows the equivalent electrical circuit of the 4-terminal composite switched emitter structures.

The numerous innovative teachings of the present application will be described with particular reference to the presently preferred embodiment (by way of example, and not of limitation), in which:

FIG. 1B shows the equivalent electrical circuit of a 4-terminal composite switched-emitter structure. This circuit consists of a high-voltage bipolar power transistor T connected by means of its emitter to the drain of a low-voltage MOS power transistor P.

Figure 2:
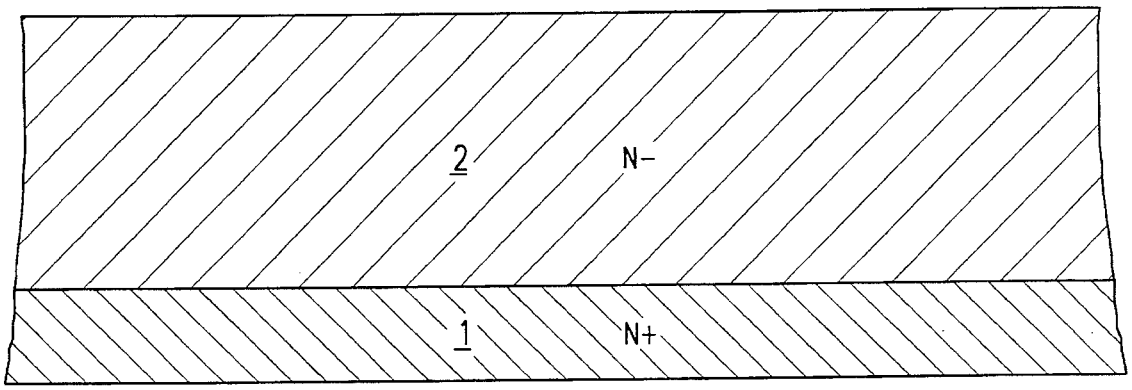
FIGS. 2–7 are diagrammatic sections which show a vertical switched emitter structure during the various stages of the manufacturing process of U.S. Pat. Nos. 5,118,635 and 5,065,213.
Figure 3:
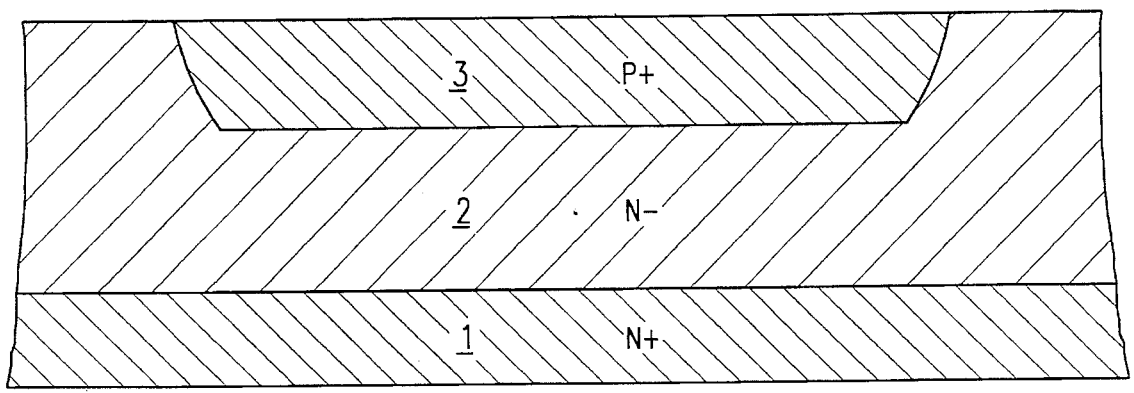
Figure 4:
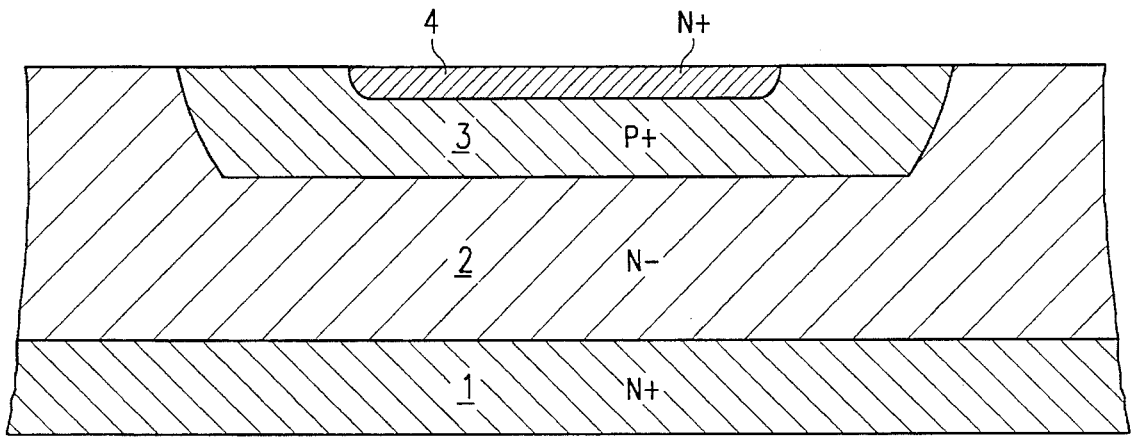
Figure 5:
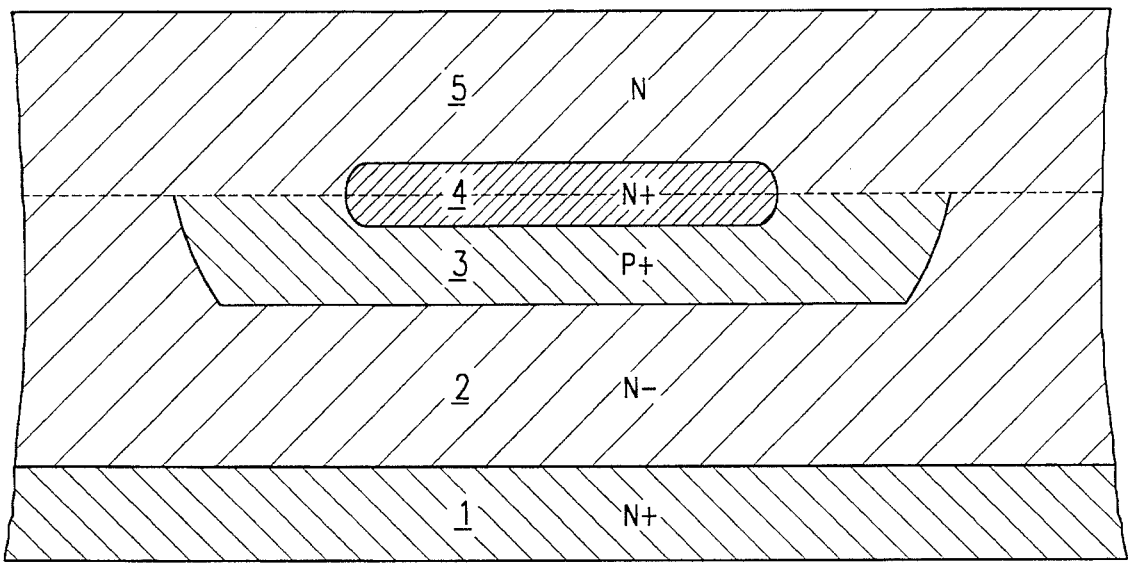
Figure 6:
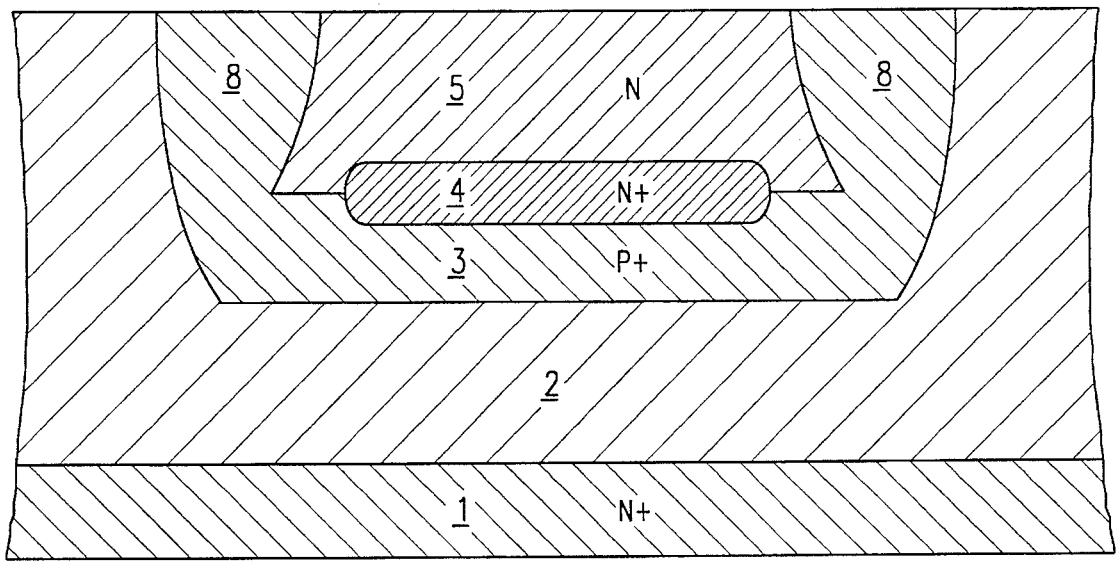
Figure 7:
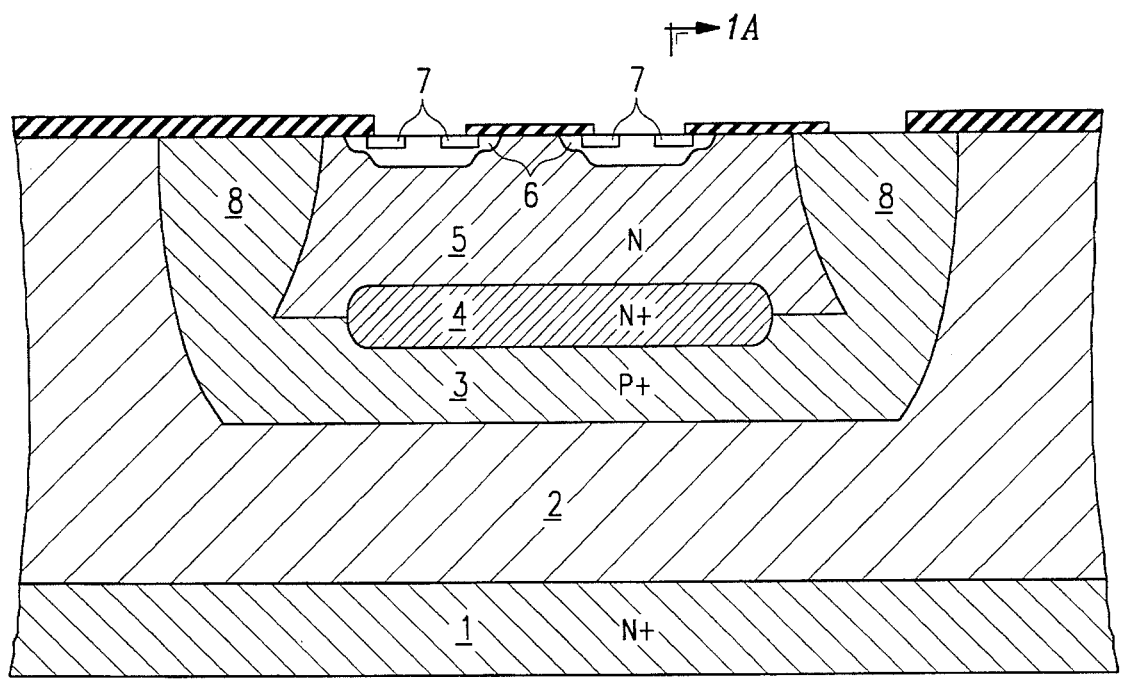
Figure 8:
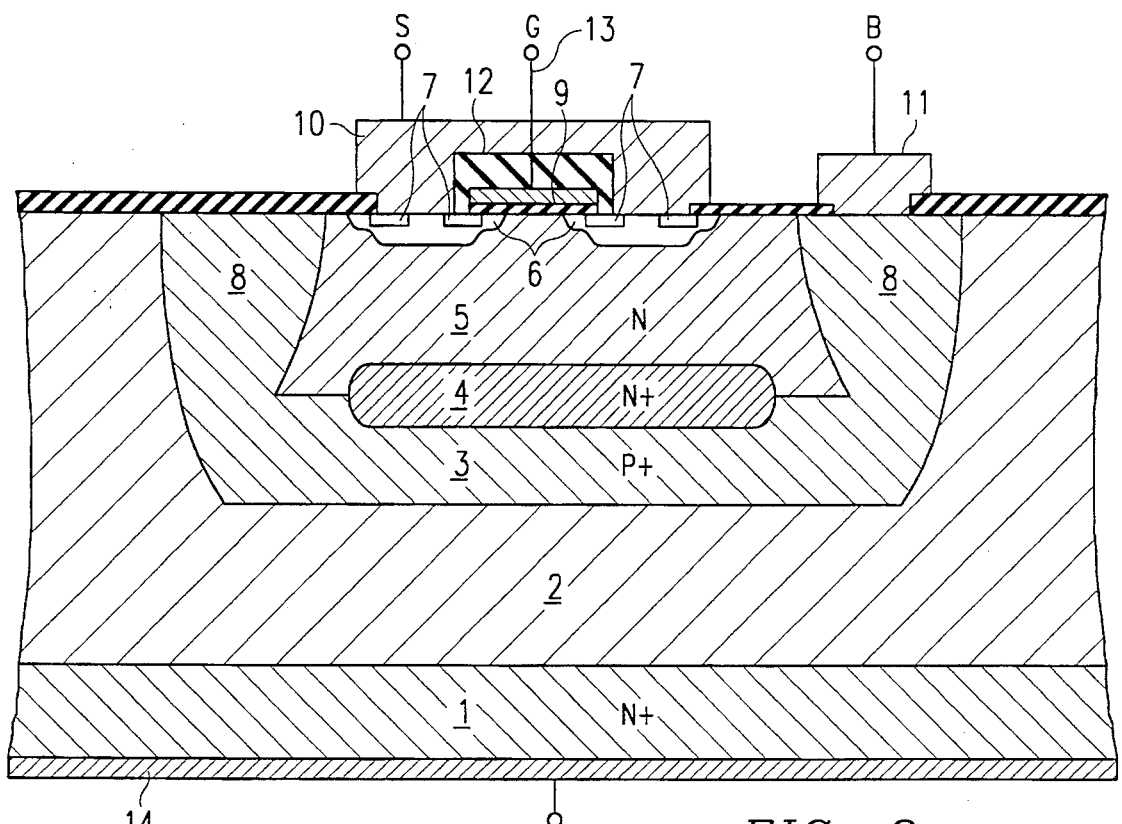
FIG. 8 is a section which shows the structure obtained at the end of the process of FIGS. 2–7.
Figure 9:
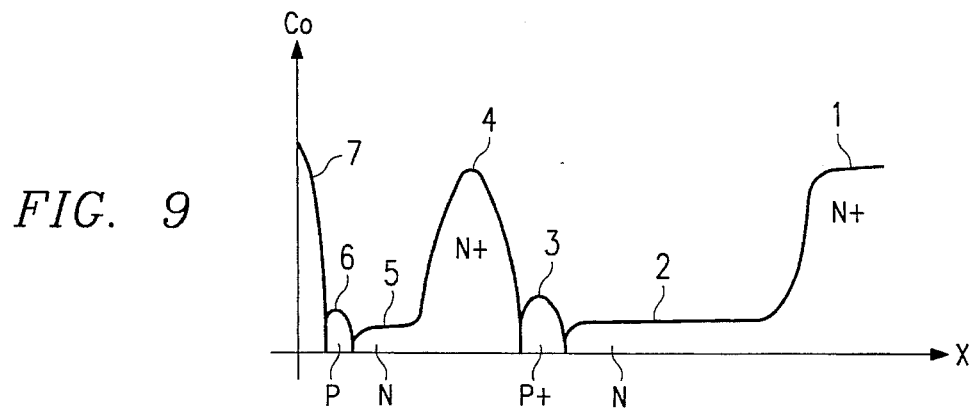
FIG. 9 is a diagram of the concentrations of the various types of doping agent along a section of the structure of FIG. 7.

The various stages of the VDMOS/NPN manufacturing process of the above-referenced patents will now be described. A first high resistivity N− conductivity epitaxial layer 2 is grown on an N+ type substrate 1 (FIG. 2). A P+ type region 3 is then obtained, by deposition or implantation and subsequent diffusion, on the layer 2 (FIG. 3). An N+ type region 4 is then obtained by means of the same process (FIG. 4). This is followed by the growth of a second N type epitaxial layer 5 (FIG. 5) and, by the known procedures of oxidation, photomasking, implantation and diffusion, the creation of the P+ type regions 8, which enable the region 3 constituting the base of the bipolar transistor to be connected on the surface (FIG. 6). A low-voltage vertical MOS power transistor and in particular the relative P conductivity body regions 6, N+ type source regions 7 (FIG. 7), the gate 9 and the metal coatings 10, 11 and 14 for ensuring the ohmic contact with the regions 6, 7, 8 and the substrate 1 (FIG. 8) are then created in the area between the two regions 8, according to known procedures. FIG. 8 shows the final structure, as it appears after addition of the terminals C (collector), B (base), S (source) and G (gate) and the insulating layer 12 of the gate 9 (the gate being connected to the relative terminal by means of the insulated conductor 13). Regions 1, 2, 3 and 4 of the figure constitute, respectively, the collector, the base and the emitter of a bipolar transistor, while region 5 constitutes the drain of the MOS. The drain is consequently connected directly to the emitter of the bipolar transistor, thus forming a structure having as its equivalent circuit the circuit of FIG. 1B. The emitter 4 represents a completely buried N+ type active region; by growing a second N type epitaxial layer 5 it is thus possible to connect the drain of the MOS to the emitter 4 of the bipolar transistor. The profile of the concentration (Co) of the various types of doping agent in the different regions of the structure, along section A—A of FIG. 7, is shown in FIG. 9, where axis x refers to the distance from the upper surface of the structure. The final structure obtained is provided with 4 terminals, 3 of the terminals being located on one face of the chip and the 4th on the other face.

FIG. 1A is a cross-section which shows both a first embodiment of the invention (on the left side) and a second embodiment (on the right side). In these embodiments, the vertical MOS device is built in a top p- epi layer, and is laterally dielectrically isolated from the sinker diffusions which make contact to the base of the bipolar transistor.

In the illustrated structure the field-effect device is located in the middle of the top p-epi layer. Only one VMOS transistor is illustrated, but of course an array of vertical-current-flow field-effect transistors (VMOS or otherwise) can be used instead of the single device shown.

The first embodiment of the invention (on the left side) uses V-grooves to provide this isolation, and the second embodiment of the invention (on the right side of this figure) uses a refilled trench. The transistor itself is preferably formed with the same silicon etch used to define the isolation.

If trench isolation is coupled with the use of a trench MOSFET for other purposes, then the use of a p-type epitaxial layer 6' becomes particularly attractive from a process point of view. (Similar considerations apply to the combination of V-groove isolation with VMOS transistors, although this combination is less compatible with current trends of process development.)

The process flow described above is modified, after the step of FIG. 6, to form trenches 102 or grooves 104 in the epitaxial layer 130 as shown, either before or after source and/or gate formation. According to conventional methods, the isolation trenches 102 (or the isolation grooves 104) are refilled with e.g. oxide 103. Whichever kind of recess is used, the MOS transistors 111 are fabricated with insulated gates 112 which extend down into the recesses to provide capacitive coupling to the p- epi layer along the sidewalls of the groove.

In a sample embodiment, the P- epi layer 130 is between 0.8 and 3 microns thick, and is doped to a value in the range of $10^{15}$ cm$^{-3}$–$10^{16}$ cm$^{-3}$. The grooves or trenches are preferably etched to a depth of at least 0.5 μm greater than the epi layer.

The described process can obviously be used to simultaneously obtain, on the same chip, several pairs of bipolar and MOS transistors having a collector terminal in common and their base contacts, sources and gates connected to three respective common terminals by means of a metal coating carried out on the front of the chip at the end of the process.

Description of trench transistor fabrication processes can be found in the annual proceedings of the ISPSD conference (INTERNAT'L SYMPOSIUM ON POWER SC DEVICES AND ICS), all volumes of which are hereby incorporated by reference, and in the annual IEDM proceedings, years 1975–1994 of which are hereby incorporated by reference.

According to a disclosed class of innovative embodiments, there is provided: A solid-state device structure, comprising, in a substantially monocrystalline body of semiconductor between first and second surfaces thereof: a collector, extending to said first surface, which is heavily doped with a first conductivity type; a drift region, overlying said collector, which has said first conductivity type and is more lightly doped than said collector; a base region, overlying said drift region, which has a second conductivity type; a drain/emitter region, overlying said base region, which is heavily doped with said first conductivity type; a body region, overlying said drain/emitter region, which has said second conductivity type; a source region, overlying said body region, which is heavily doped with said first conductivity type; a gate electrode which is in proximity to said second surface of said monocrystalline body, and which extends into a recess therein, and which is capacitively coupled to said body region to controllably induce therein a channel which provides a current path between said source region and said drain/emitter region; sinker diffusions of said second conductivity type which extend from said second surface to said base region; and dielectric isolation which is interposed to laterally separate said body region from surface portions of said sinker diffusions.

According to another disclosed class of innovative embodiments, there is provided: A solid-state device structure, comprising, in a substantially monocrystalline body of semiconductor between first and second surfaces thereof: a collector, extending to said first surface, which is heavily doped with a first conductivity type; a drift region, overlying said collector, which has said first conductivity type and is more lightly doped than said collector; a base region, overlying said drift region, which has a second conductivity type; a drain/emitter region, overlying said base region, which is heavily doped with said first conductivity type; a body region, overlying said drain/emitter region, which has said second conductivity type; a source region, overlying said body region, which is heavily doped with said first conductivity type; a gate electrode which is in proximity to said second surface of said monocrystalline body, and which extends into a recess therein, and which is capacitively coupled to said body region to controllably induce therein a channel which provides a current path between said source region and said drain/emitter region; sinker diffusions of said second conductivity type which extend from said second surface to said base region; and said body region being formed in a surface epitaxial layer of said second conductivity type which is cut to laterally separate said body region from surface portions of said sinker diffusions.

According to another disclosed class of innovative embodiments, there is provided: A solid-state device structure, comprising, in a substantially monocrystalline body of semiconductor between first and second surfaces thereof; a vertical MOS device, comprising a respective first diffusion of a first conductivity type in proximity to said first surface of said monocrystalline body, a second diffusion of said first conductivity type within said body, a body diffusion of a second conductivity type, in proximity to said first surface of said monocrystalline body, which totally surrounds said first diffusion, and an insulated gate electrode and which extends into a recess in said body and is capacitively coupled to regulate current flow between said first and second diffusions; a high-voltage bipolar device, comprising a respective first diffusion of a first conductivity type in proximity to said second surface of said monocrystalline body, and a second diffusion of a first conductivity type within said body, and a respective base region interposed to regulate current flow between said respectively first and second diffusions, and sinker diffusions of said second conductivity type which extend from said second surface to said base region; wherein said MOS device directly overlies said first and second diffusions of said bipolar device, and wherein said second diffusion of said MOS device is merged with said second diffusion of said bipolar device, and wherein said body diffusion of said MOS device is laterally isolated from said sinker diffusion by a dielectric isolation region.

According to another disclosed class of innovative embodiments, there is provided: A process for manufacturing a microelectronic structure which includes a vertical high-voltage bipolar power transistor, and which also includes a vertical low-voltage MOS power transistor structure extending to a front surface thereof, comprising the steps of: a) on an N+ type substrate, growing a first high resistivity N-type epitaxial layer, to provide the collector of the bipolar transistor; b) creating, near the front surface of said first epitaxial layer, a P+ region to provide a base of the bipolar transistor, and an N+ type region, which is shallower than said P+ region, to provide an emitter of the bipolar transistor; c) growing at least one additional N-type epitaxial layer above said first epitaxial layer; d) forming, in said additional epitaxial layer, a P-type body region, and an N-type source region which is shallower than said body region, and a P+ sinker region which provides ohmic contact to said base region, and lateral dielectric isolation which laterally separates said sinker region from said body region, and additional recesses extending into said body region; and e) creating, in said recesses, an insulated gate electrode which is capacitively coupled to at least some portions of said body which are laterally adjacent to said source region.

According to another disclosed class of innovative embodiments, there is provided: A process for manufacturing a solid-state structure which includes a high-voltage bipolar power transistor, and which also includes a vertical low-voltage MOS power transistor in proximity to a front surface of the structure, comprising the steps of: a) providing a monolithic semiconductor structure which includes a first region which is heavily doped with a first conductivity type and a second region which has said first conductivity type and is more lightly doped than said first region, and also providing a metallic backside contact to said first region; b) creating, in proximity to an upper surface of said monolithic semiconductor structure, a third region which is doped with a second conductivity type, and a fourth region which is heavily doped with said first conductivity type; c) epitaxially growing an additional layer of first-conductivity-type semiconductor material above said monolithic structure; d) forming, in proximity to said front surface, a body diffusion of said second conductivity type, and at least one source diffusion of said first conductivity type which is completely separated by said body diffusion from other portions of said additional layer of material, a second-conductivity-type diffusion which extends upward from said third region, dielectric isolation which laterally separates said second-conductivity-type diffusion from said body region, and one or more additional recesses in said body region; and e) creating, atop said second epitaxial layer, an insulated gate electrode which extends into said recessesis capacitively coupled to at least some portions of said body which are laterally adjacent to said source region.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

The structure can very advantageously be integrated, since the process compatibility issues for integrated DMOS device structures are now well understood. However, this structure can also, alternatively and less preferably, be used for a discrete device.

Many other modifications can be made while still using the innovative concepts. For example, an additional epitaxial layer can be grown, if desired, between the first and second epitaxial layers.

For another example, heterojunctions (Si/SiGe or $SiGe_x$/$SiGe_y$) can be used to introduce pseudopotentials into the illustrated structures.

For another example, a backside-implanted N+ collector can optionally be used instead of the N+ substrate.

For another example, the innovative device can alternatively be implemented as the dual structure, i.e. as a P-channel FET overlying a high-voltage PNP bipolar device.

For another example, some carrier regeneration can be added to reduce the on-resistance (e.g. by adding a patterned p+ diffusion on the backside). However, it is preferable NOT to have enough regeneration to trigger thyristor firing, since that would mean that the MOS structures would be exposed to the full high voltage of the collector terminal.)

What is claimed is:

1. A solid-state device structure, comprising, in a substantially monocrystalline body of semiconductor between first and second surfaces thereof:

a collector, extending to said first surface, which is heavily doped with a first conductivity type;

a drift region, overlying said collector, which has said first conductivity type and is more lightly doped than said collector;

a base region, overlying said drift region, which has a second conductivity type;

a drain/emitter region, overlying said base region, which is heavily doped with said first conductivity type;

a body region, overlying said drain/emitter region, which has said second conductivity type;

a source region, overlying said body region, which is heavily doped with said first conductivity type;

a gate electrode which is in proximity to said second surface of said monocrystalline body, and which extends into a recess therein, and which is capacitively coupled to said body region to controllably induce therein a channel which provides a current path between said source region and said drain/emitter region;

sinker diffusions of said second conductivity type which extend from said second surface to said base region; and dielectric isolation which is interposed to laterally separate said body region from surface portions of said sinker diffusions.

2. The device structure of claim 1, wherein said drain/emitter region comprises an emitter region, overlying said base region, which is heavily doped with said first conductivity type; and a drain region, overlying said emitter region, which has said first conductivity type and is more lightly doped than said emitter region.

3. The device structure of claim 1, wherein said first conductivity type is N-type and said second conductivity type is P-type.

4. The device structure of claim 1, wherein said gate electrode is insulated from said body region.

5. A solid-state device structure, comprising, in a substantially monocrystalline body of semiconductor between first and second surfaces thereof:

a collector, extending to said first surface, which is heavily doped with a first conductivity type;

a drift region, overlying said collector, which has said first conductivity type and is more lightly doped than said collector;

a base region, overlying said drift region, which has a second conductivity type;

a drain/emitter region, overlying said base region, which is heavily doped with said first conductivity type;

a body region, overlying said drain/emitter region, which has said second conductivity type;

a source region, overlying said body region, which is heavily doped with said first conductivity type;

a gate electrode which is in proximity to said second surface of said monocrystalline body, and which extends into a recess therein, and which is capacitively coupled to said body region to controllably induce therein a channel which provides a current path between said source region and said drain/emitter region;

sinker diffusions of said second conductivity type which extend from said second surface to said base region; and said body region being formed in a surface epitaxial layer of said second conductivity type which is cut to laterally separate said body region from surface portions of said sinker diffusions.

6. The device structure of claim 5, wherein said drain/emitter region comprises an emitter region, overlying said base-region, which is heavily doped with said first conductivity type; and a drain region, overlying said emitter region, which has said first conductivity type and is more lightly doped than said emitter region.

7. The device structure of claim 5, wherein said first conductivity type is N-type and said second conductivity type is P-type.

8. The device structure of claim 5, wherein said gate electrode is insulated from said body region.

9. A solid-state device structure, comprising, in a substantially monocrystalline body of semiconductor between first and second surfaces thereof;

a vertical MOS device, comprising a respective first diffusion of a first conductivity type in proximity to said first surface of said monocrystalline body, a second diffusion of said first conductivity type within said body, a body diffusion of a second conductivity type, in proximity to said first surface of said monocrystalline body, which totally surrounds said first diffusion, and an insulated gate electrode and which extends into a recess in said body and is capacitively coupled to regulate current flow between said first and second diffusions;

a high-voltage bipolar device, comprising a respective first diffusion of a first conductivity type in proximity to said second surface of said monocrystalline body, and a second diffusion of a first conductivity type within said body, and a respective base region interposed to regulate current flow between said respectively first and second diffusions, and sinker diffusions of said second conductivity type which extend from said second surface to said base region;

wherein said MOS device directly overlies said first and second diffusions of said bipolar device, and wherein said second diffusion of said MOS device is merged with said second diffusion of said bipolar device, and wherein said body diffusion of said MOS device is laterally isolated from said sinker diffusion by a dielectric isolation region.

10. The device structure of claim 9, wherein said drain/emitter region comprises an emitter region, overlying said base region, which is heavily doped with said first conductivity type; and a drain region, overlying said emitter region, which has said first conductivity type and is more lightly doped than said emitter region.

11. The device structure of claim 9, wherein said first conductivity type is N-type and said second conductivity type is P-type.

12. The device structure of claim 9, wherein said gate electrode is insulated from said body region.

* * * * *